(12) United States Patent
Lee et al.

(10) Patent No.: US 9,343,433 B2
(45) Date of Patent: May 17, 2016

(54) PACKAGES WITH STACKED DIES AND METHODS OF FORMING THE SAME

(71) Applicant: Taiwan Semiconductor Manufacturing Company, Ltd., Hsin-Chu (TW)

(72) Inventors: Chien-Hsun Lee, Chu-tung Town (TW); Tsung-Ding Wang, Tainan (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 73 days.

(21) Appl. No.: 14/166,399

(22) Filed: Jan. 28, 2014

(65) Prior Publication Data

US 2015/0214191 A1 Jul. 30, 2015

(51) Int. Cl.
*H01L 21/44* (2006.01)
*H01L 25/065* (2006.01)
*H01L 21/56* (2006.01)
*H01L 23/00* (2006.01)
*H01L 23/367* (2006.01)
*H01L 23/373* (2006.01)
*H01L 23/498* (2006.01)

(52) U.S. Cl.
CPC .......... *H01L 25/0657* (2013.01); *H01L 21/561* (2013.01); *H01L 23/3675* (2013.01); *H01L 23/3736* (2013.01); *H01L 23/49827* (2013.01); *H01L 24/97* (2013.01); *H01L 2224/16145* (2013.01); *H01L 2224/16225* (2013.01); *H01L 2224/32225* (2013.01); *H01L 2224/73204* (2013.01); *H01L 2924/0002* (2013.01)

(58) Field of Classification Search
CPC .............. H01L 23/5226; H01L 23/481; H01L 2924/01078–2924/01079
USPC .......... 438/106, 109, 652, 689, 110; 257/686, 257/777
See application file for complete search history.

(56) References Cited

U.S. PATENT DOCUMENTS

2012/0098145 A1* 4/2012 Yoshida .................. H01L 24/97
257/774

* cited by examiner

*Primary Examiner* — Hoa B Trinh
(74) *Attorney, Agent, or Firm* — Slater Matsil, LLP

(57) ABSTRACT

A method includes bonding a first plurality of device dies onto a wafer, wherein the wafer includes a second plurality of device dies, with each of the first plurality of device dies bonded to one of the second plurality of device dies. The wafer is then sawed to form a die stack, wherein the die stack includes a first device die from the first plurality of device dies and a second device die from the second plurality of device dies. The method further includes bonding the die stack over a package substrate.

20 Claims, 9 Drawing Sheets

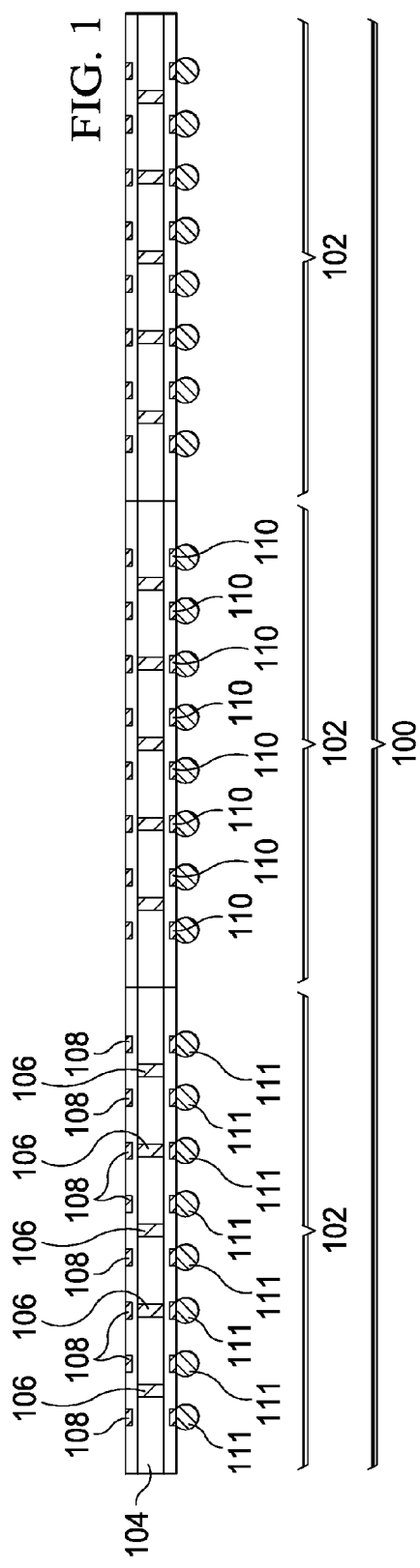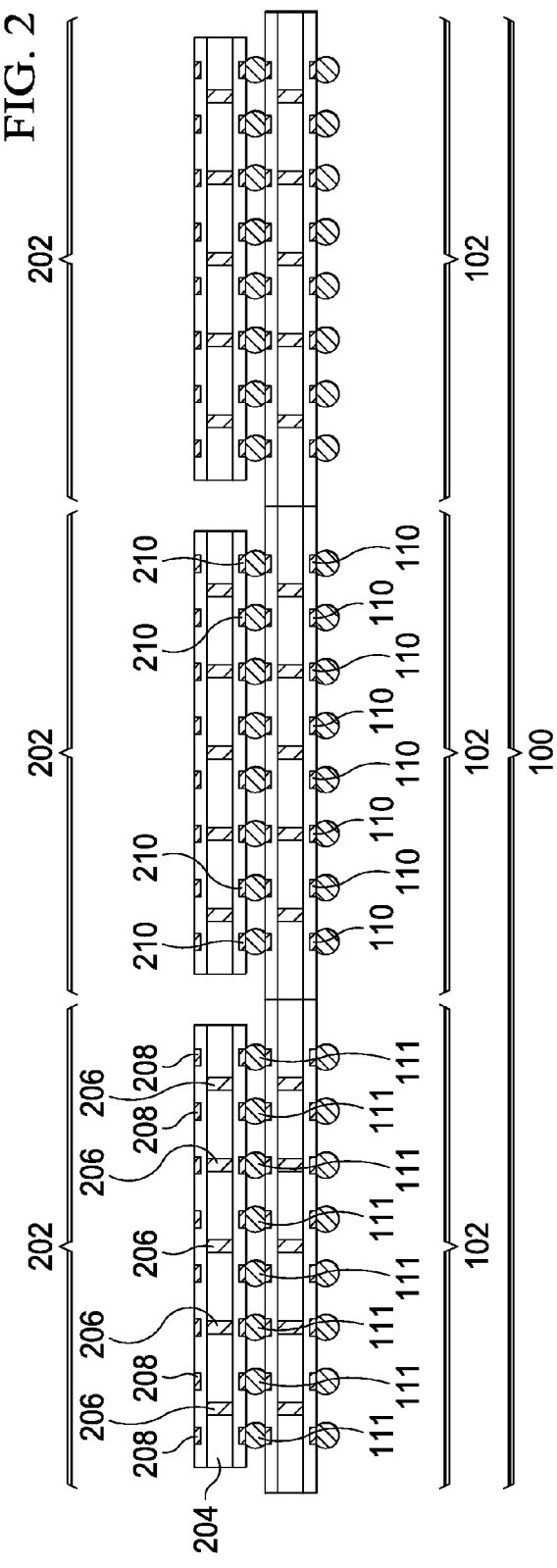

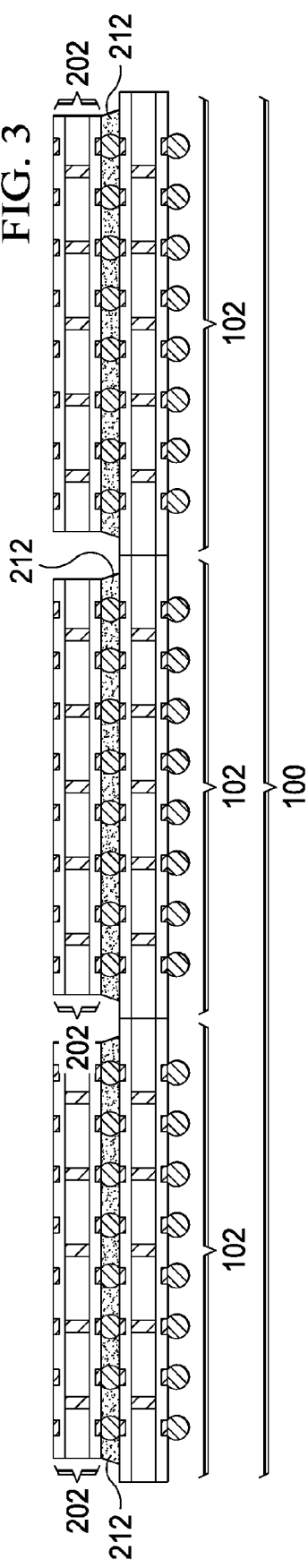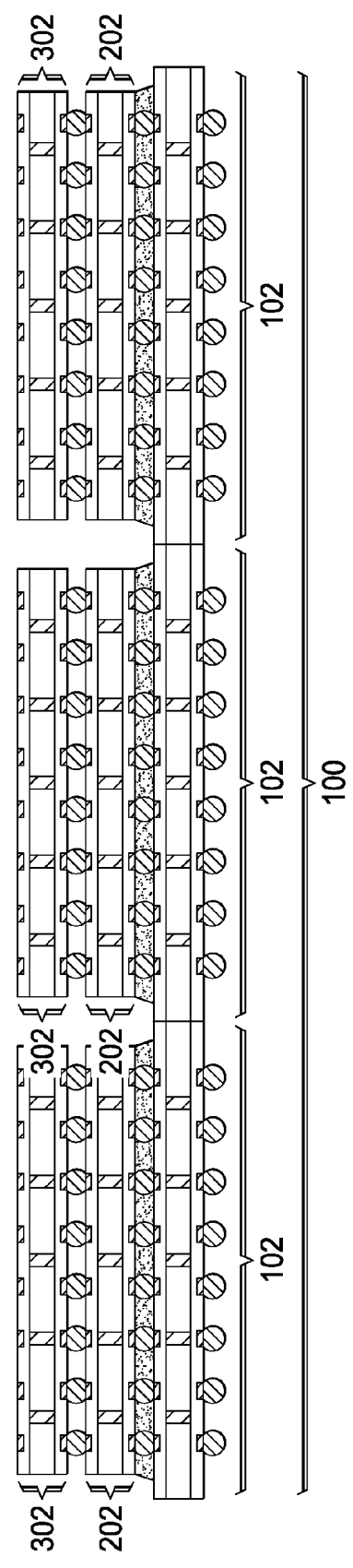

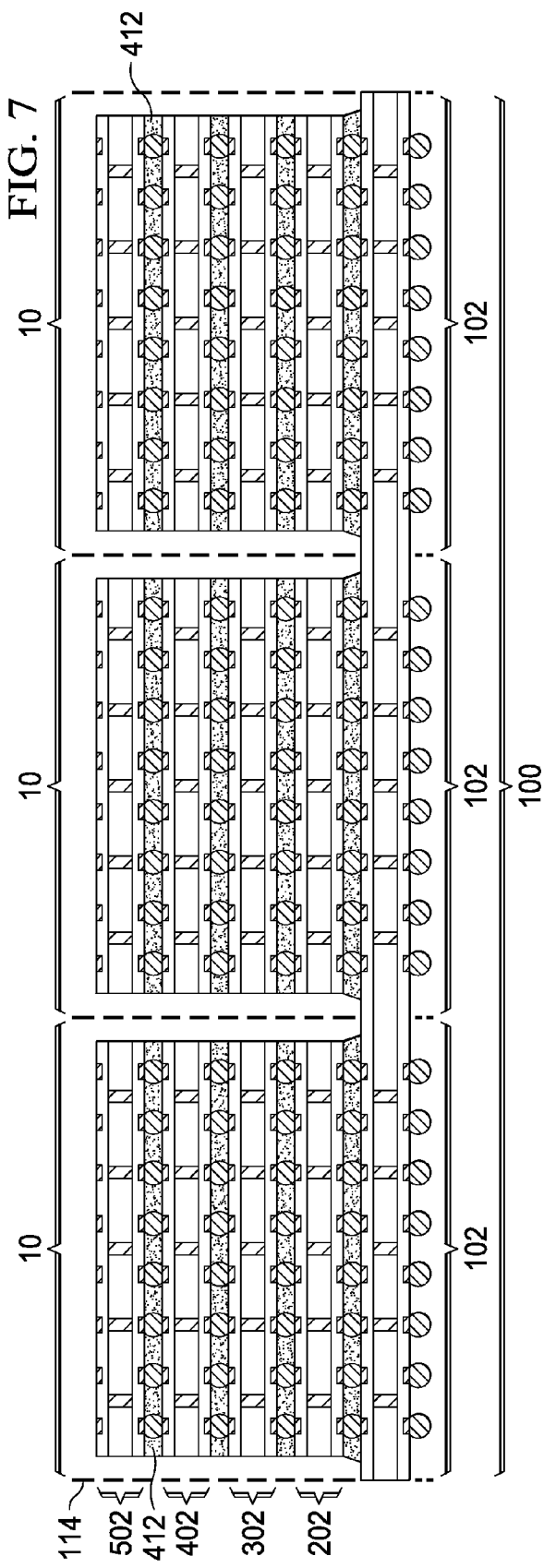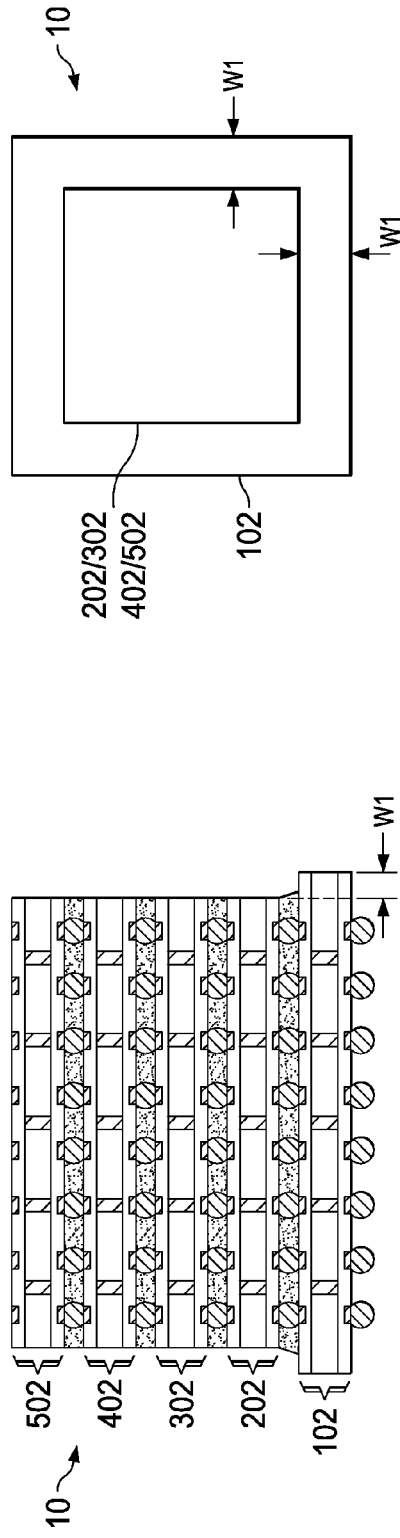

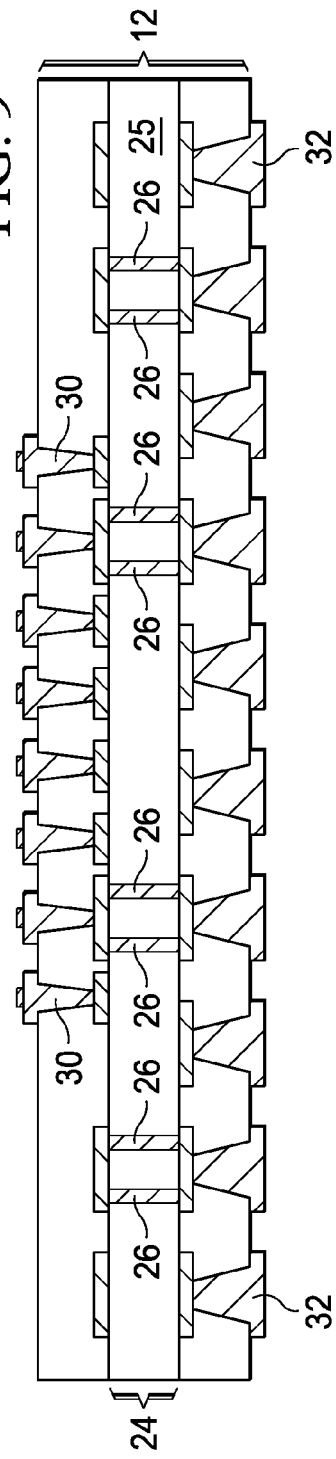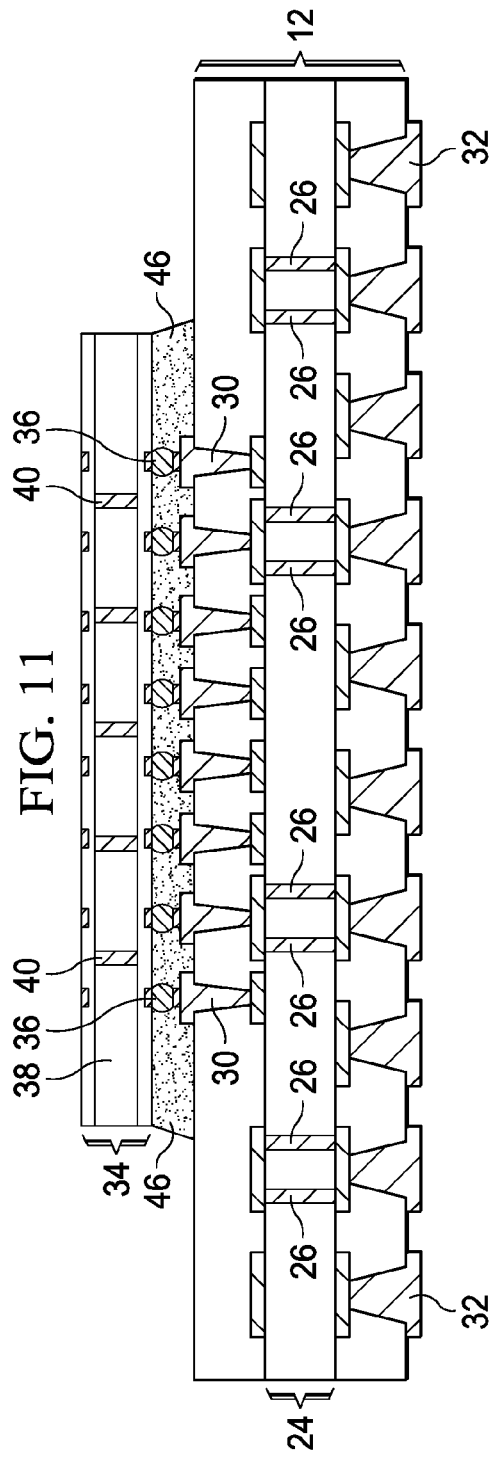

PACKAGES WITH STACKED DIES AND METHODS OF FORMING THE SAME

BACKGROUND

Stacked dies are commonly used in Three-Dimensional (3-D) integrated circuits. Through the stacking of dies, the footprint of packages is reduced. In addition, the metal line routing in the dies is significantly simplified through the formation of stacked dies.

In some applications, a plurality of stacked dies is stacked to form a die stack. The total count of the stacked dies may sometimes reach eight or more. When such a die stack is formed, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate correctly, and the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly, and the first die, the second die, and the package substrate function as desired. Next, a third die is bonded onto the second die through the same process steps as for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7 illustrate the cross-sectional views of intermediate stages in the formation of a die stack in accordance with some embodiments;

FIG. 8A illustrates a cross-sectional view of a die stack in accordance with some embodiments;

FIG. 8B illustrates a top view of a die stack in accordance with some embodiments;

FIGS. 9 through 13 illustrate the cross-sectional views of intermediate stages in the formation of a package in accordance with some embodiments.

DETAILED DESCRIPTION

Figure 5:
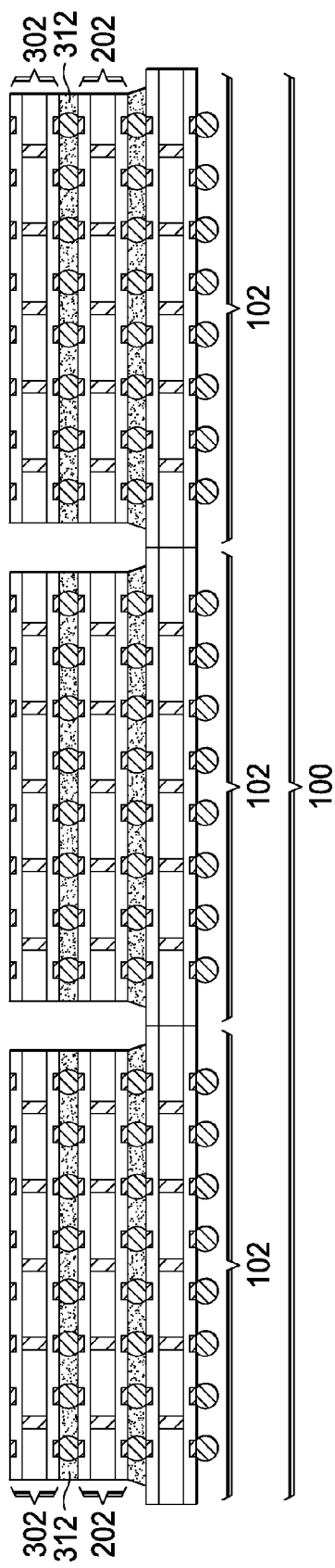

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Referring to FIG. 1, wafer 100 is provided. Wafer 100 includes a plurality of device dies 102, which have circuits identical to each other. In some embodiments, wafer 100 is a memory wafer, and device dies 102 are memory device dies, which may be Static Random Access Memory (SRAM) device dies, Dynamic Random Access Memory (DRAM) device dies, Magneto-resistive Random Access Memory (MRAM) device dies, or the like. In alternative embodiments, device dies 102 are logic device dies that include logic circuits such as mobile application circuits, for example.

Device dies 102 includes semiconductor substrate 104, wherein the active devices (not shown) such as transistors are formed at a surface of semiconductor substrate 104. In some embodiments, semiconductor substrate 104 is a crystalline silicon substrate. In alternative embodiments, semiconductor substrate 104 includes another semiconductor material such as germanium, silicon germanium, a III-V compound semiconductor material, or the like. Metal lines and vias (not shown) are formed in the interconnect structures of device dies 102 to interconnect the integrated circuit devices in device dies 102.

Through-vias (sometimes referred to as Through-Silicon Vias (TSVs) or through-semiconductor vias) 106 are formed to penetrate through semiconductor substrate 104. Additional electrical connectors (such as metal pads, metal pillars, or metal pillars/pads and the overlying solder layers) 108 are formed on the top surfaces of device dies 102. Electrical connectors 110 are formed at the bottom surfaces of device dies 102. Electrical connectors 108 and 110 may be metal pads, metal pillars, or the like. Electrical connectors 108 are electrically coupled to electrical connectors 110 through through-vias 106. In some embodiments, solder balls 111 are attached to electrical connectors 110. In alternative embodiments, no solder balls are attached to electrical connectors 110.

Next, referring to FIG. 2, device dies 202 are bonded to device dies 102 through flip-chip bonding. The respective bonding process is referred to as a chip-on-wafer bonding. In accordance with some embodiments of the present disclosure, device dies 202 are memory device dies, which may include SRAM device dies, DRAM device dies, MRAM device dies, or the like. In alternative embodiments, device dies 202 are logic device dies that include logic circuits such as mobile application circuits, for example. In some embodiments, the circuits in device dies 202 are identical to those of device dies 102. In alternative embodiments, the circuits in device dies 102 and device dies 202 are different from each other.

Each of device dies 202 includes semiconductor substrate 204, wherein the active devices (not shown) such as transistors are formed at a surface of semiconductor substrate 204. In some embodiments, semiconductor substrate 204 is a crystalline silicon substrate. In alternative embodiments, semiconductor substrate 204 includes another semiconductor material such as germanium, silicon germanium, a III-V compound semiconductor material, or the like. Metal lines and vias (not shown) are formed in the interconnect structures of device dies 202 to interconnect the integrated circuit devices in device dies 202.

Through-vias 206 are formed to penetrate through semiconductor substrate 204. Additional electrical connectors 208 are formed on the top surfaces of device dies 102. Electrical connectors 210 are formed at the bottom surfaces of device dies 202. Electrical connectors 208 and 210 may be metal pads, metal pillars, or the like. Electrical connectors 208 are electrically coupled to electrical connectors 210 through through-vias 106. Furthermore, the integrated circuits in device dies 202 and electrical connectors 208 are electrically connected to electrical connectors 110 in device dies 102.

FIG. 3 illustrates the dispensing and the curing of underfill 212. In some embodiments, underfill 212 is dispensed into the gaps between device dies 102 and the respective overlying device dies 202. The gaps between neighboring device dies 202 are not dispensed with underfill 212. Underfill 212 is then cured, for example, in a thermal curing process. The curing may be performed at a temperature in the range between about 100° C. and about 165° C., for example, for a period of time in the range between about 30 minutes and about 120 minutes. After the curing, underfill 212 is solidified.

FIGS. 4 and 5 illustrate the bonding of device dies 302 and the dispensing of underfilling material 312, which may be an underfill, a Non-Conductive Paste (NCP), or a Non-Conductive Film (NCF) 312. Referring to FIG. 4, device dies 302 are bonded to device dies 202 with a one-to-one correspondence. In some embodiments, device dies 302 are identical to device dies 202. In these embodiments, device dies 202 and 302 may be formed using identical process steps, wherein the different reference numerals 202 and 302 are merely used to indicate that they are at different levels in the die stacks. In alternative embodiments, device dies 202 and 302 have different structures including different circuits and/or different metal routing, etc.

Next, as shown in FIG. 5, underfilling material 312 is dispensed and cured. In some embodiments, underfilling material 312 is dispensed into the gaps between device dies 202 and the respective overlying device dies 302. The gaps between neighboring device dies 302 are not dispensed with underfilling material 312. Underfilling material 312 is then cured, for example, in a thermal curing process. The curing may be performed using same conditions as curing underfill 212. For example, the curing may be performed at a temperature in the range between about 100° C. and about 165° C., and for a period of time in the range between about 30 minutes and about 120 minutes. After the curing, underfilling material 312 is solidified.

Figure 6:
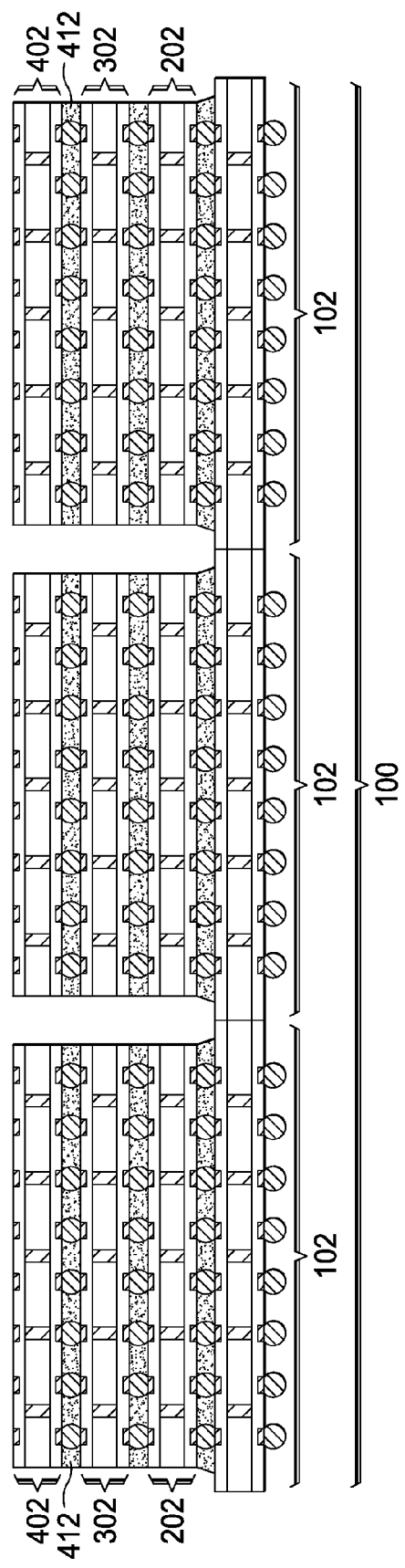

FIG. 6 illustrates the bonding of device dies 402 and the dispensing of underfilling material 412, which may be an underfill, a NCP, or an NCF. Device dies 402 are bonded to device dies 302 with a one-to-one correspondence. Again, device dies 402 may be identical to, or may be different from, device dies 302 and/or 202. The dispensing and the curing of underfilling material 412 may be the same as the dispensing and the curing of underfilling material 312.

Next, FIG. 7 illustrates the bonding of device dies 502 and the dispensing of underfilling material 512. Device dies 502 are bonded to device dies 402 with a one-to-one correspondence. Again, device dies 502 may be identical to, or may be different from, device dies 402, 302, and/or 202. The dispensing and the curing of underfilling material 512 may be the same as the dispensing and the curing of underfilling material 412.

Although not illustrated, additional device dies may be bonded over device dies 502 to increase the stacking level. Each of the additional device dies may be identical to, or may be different from, device dies 502, 402, 302, and/or 202.

Also referring to FIG. 7, a die-saw is performed along scribe line 114 in wafer 100, resulting in a plurality of die stacks 10, as illustrated in FIGS. 8A and 8B. Each of die stacks 10 includes device dies 102, 202, 302, 402, 502, and possible more device dies. In alternative embodiments, each of die stacks 10 includes fewer device dies such as two, three, or four device dies. For example, each of die stacks 10 may include only two device dies 102 and 202.

FIGS. 8A and 8B illustrate a cross-sectional view and a top view, respectively, of die stack 10. As shown in FIG. 8B, die stack 10 includes device die 102, on which one or a plurality of device dies such as 202, 302, 402, and 502 are bonded. Device die 102 has a top-view area greater than the top-view areas of the overlying device dies 202, 302, 402, and 502. This is because device die 102 is sawed from wafer 100 (FIG. 7) after the bonding of device dies, and hence a margin width W1 is left between the edges of device dies 102 and the respective edges of device dies 202/302/402/502, so that during the die-saw, device dies 202/302/402/502 are not damaged by the sawing blade. In accordance with some embodiments, margin width W1 is greater than about 10 μm, and may be in the range between about 10 μm and about 100 μm.

The device dies overlying device die 102, such as device dies 202, 302, 402, and 502, may have identical structures. For example, not only their internal circuits are the same, their sizes are also the same. For another example, device dies 202, 302, 402, and 502 may have a same top-view area, with the respective edges of device dies 202, 302, 402, and 502 aligned, as illustrated in FIGS. 8A and 8B. The respective electrical connectors of device dies 202, 302, 402, and 502 may also be aligned. Device die 102 may have a top-view area greater than the top-view areas of device dies 202, 302, 402, and 502, although device die 102 may have a same structure (except the top view size) and same circuits as device dies 202, 302, 402, and 502. For example, device dies 202, 302, 402, and/or 502 may be sawed from the wafers that are identical to wafer 100 (FIG. 1).

FIG. 9 illustrates a cross-sectional view of package substrate 12. In some exemplary embodiments, package substrate 12 is a build-up substrate that is built up from core 24. In alternative embodiments, package substrate 12 is a laminate (or build-up) substrate that includes conductive traces embedded in laminated dielectric films. In the subsequent discussion of the embodiments of the present disclosure, a build-up substrate is illustrated as an example, while the teaching revealed in accordance with the exemplary embodiments are readily applicable to laminate substrates.

The exemplary package substrate 12 in accordance with various embodiments of the present disclosure may include top electrical connectors 30, bottom electrical connectors 32, and the intermediate metal traces, vias, and the like connecting top electrical connectors 30 to bottom electrical connectors 32. Core 24 includes dielectric layer 25, and conductive pipes 26 penetrating through dielectric layer 25. Dielectric layer 25 may be formed of fiber glass or other dielectric materials.

Figure 10:
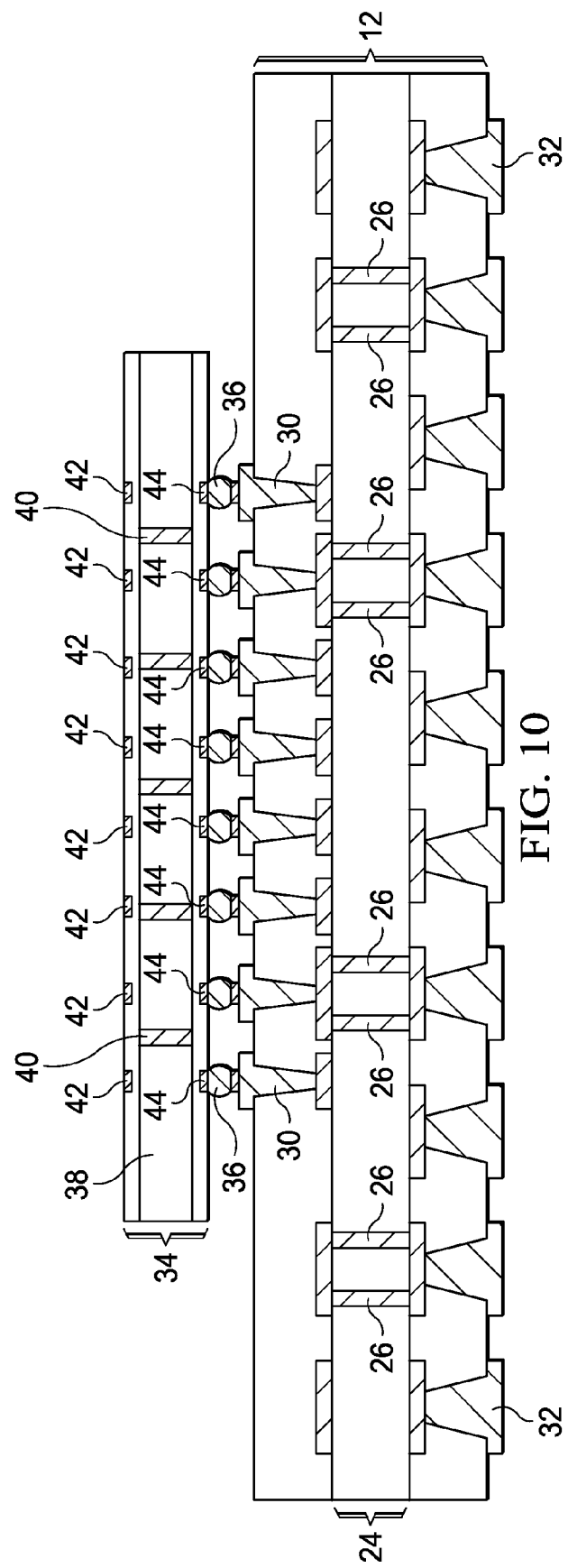

Next, referring to FIG. 10, device die 34 is bonded to package substrate 12. In some embodiments, the bonding is through solder bonding, wherein solder regions 36 bond device die 34 and package substrate 12 together. In alternative embodiments, the bonding is through metal-to-metal (for example, copper-to-copper) direct bonding. Device die 34 may be a logic die, which may further be a Central Processing Unit (CPU), a Graphic Processing Unit (GPU), or the like.

Device die 34 includes semiconductor substrate 38, wherein the active devices (not shown) such as transistors are formed at a surface of semiconductor substrate 38. Through-vias 40 are formed to penetrate through semiconductor substrate 38. Additional electrical connectors 42 are formed on the top surface of device die 34. Electrical connectors 44 are formed at the bottom surface of device die 34. Electrical connectors 42 and 44 may be metal pads, metal pillars, or the like. Electrical connectors 42 are electrically coupled to electrical connectors 36 and electrical connectors 44 through through-vias 40.

Next, as shown in FIG. 11, underfill 46 is dispensed into the gap between device die 34 and package substrate 12, and is then cured, for example, in a thermal curing step. In alternative embodiments, instead of using underfill, a Non-Conductive Film (NCF) may be disposed between device die 34 and package substrate 12.

Figure 12:
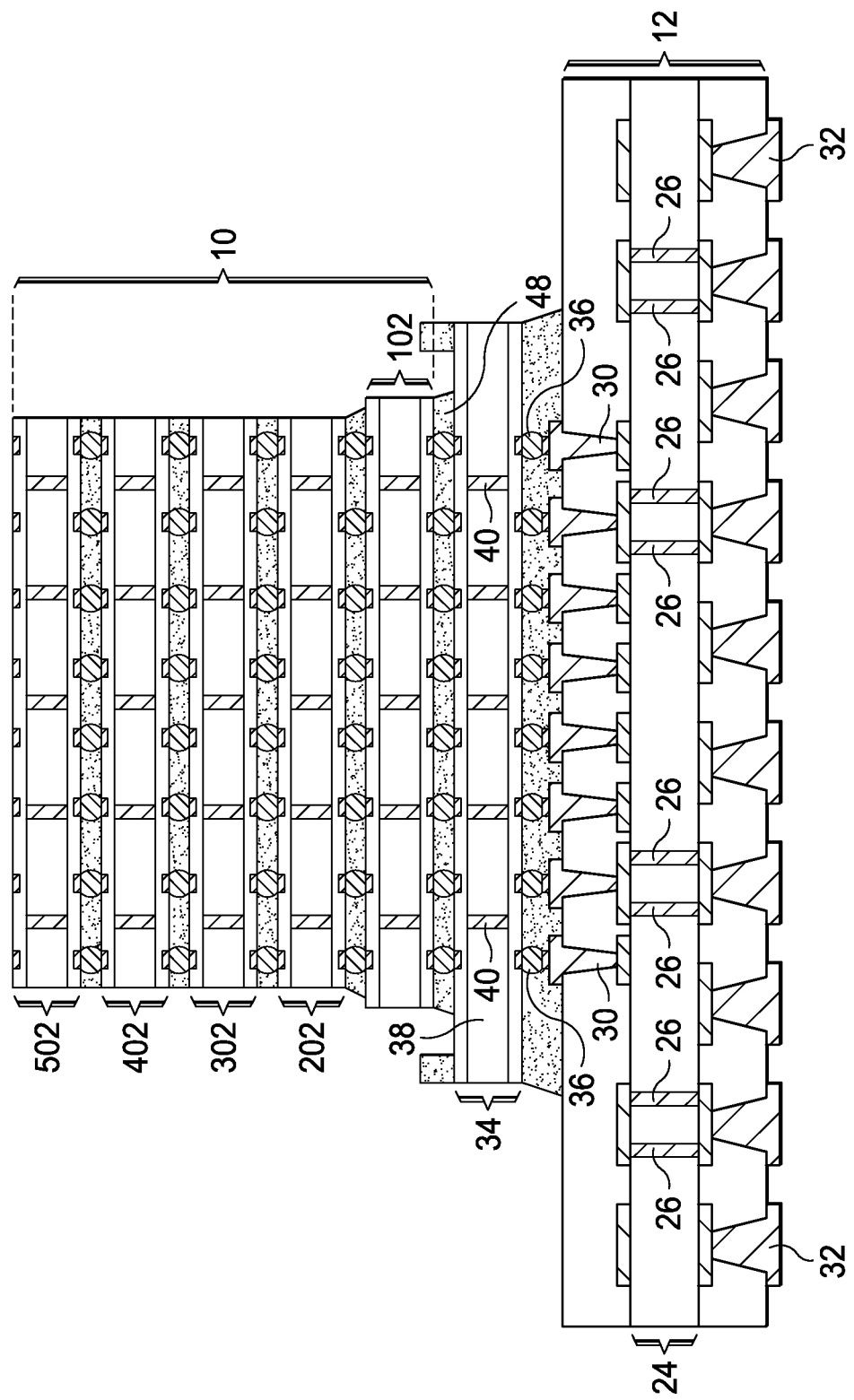

FIG. 12 illustrates the bonding of die stack 10 to device die 34. In some embodiments, as shown in FIG. 12, device die 102 in die stack 10 is bonded to device die 34, and hence device die 502 becomes the top device die in the resulting package. In alternative embodiments, as shown in FIG. 14, device die 502 is bonded to device die 34, and hence device die 102 becomes the top device die in the resulting package.

Referring back to FIG. 12, after the bonding, an underfill 48 is dispensed and cured. In the resulting structure, the top device die, which may be device die 102 (FIG. 12) or 502 (FIG. 14) in the illustrated exemplary embodiments, are electrically connected to the underlying device die 34 and package substrate 12 through the electrical connections and through-vias in the intermediate device dies such as 202, 302, and 402.

Figure 13:
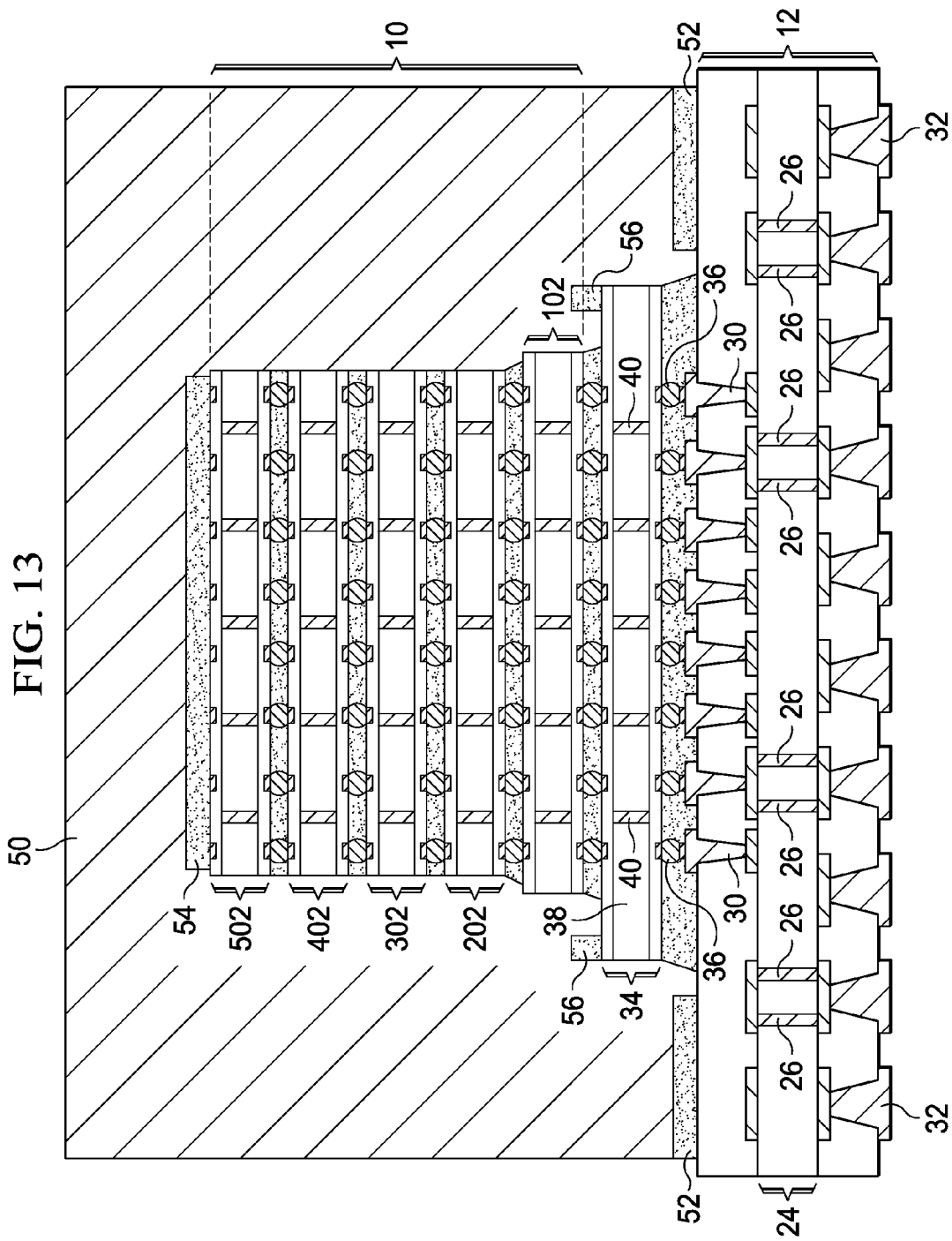

FIG. 13 illustrates the attachment of metal lid 50, which is attached to the top surface of package substrate 12 through adhesive 52. In addition, Thermal Interface Material (TIM) 54 is applied, which is an adhesive having a high thermal conductivity. In some embodiments, TIM 54 has a thermal conductivity higher than about 1 W/m*K or higher. TIM 54 joins the top die (such as device die 502) in die stack 10 with metal lid 50, so that the heat generated in die stack 10 may be dissipated to metal lid 50. Metal lid 50 may also be attached to the top surface of device die 34 through TIM or adhesive 56. Metal lid 50 may be formed of copper, aluminum, stainless steel, or the like.

Figure 14:
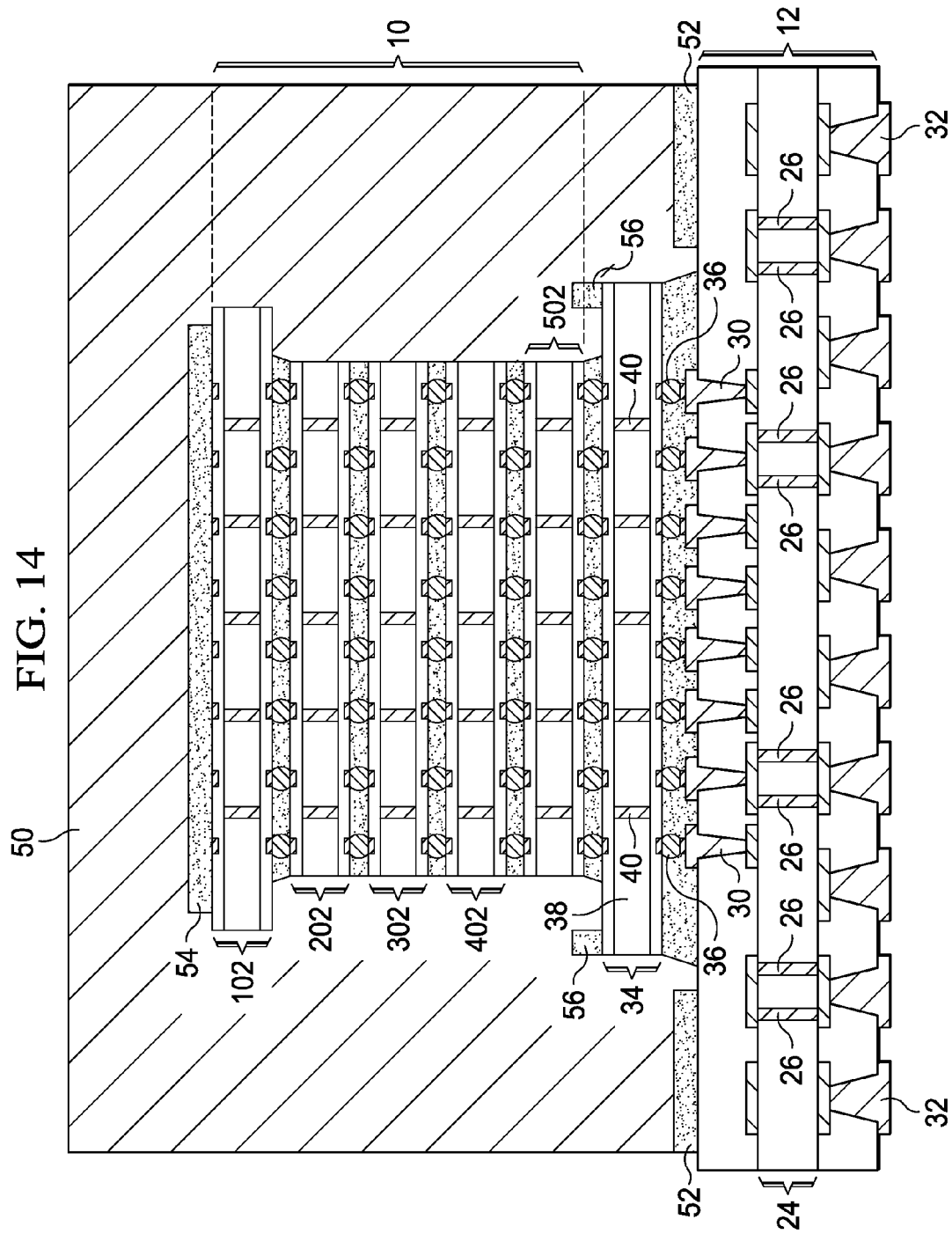
FIG. 14 illustrates a cross-sectional view of a package in accordance with some embodiments.

FIG. 14 illustrates a package in accordance with alternative embodiments of the present disclosure. These embodiments are similar to the embodiment in FIG. 13, except that device die 102 is the top device die.

Various embodiments of the present disclosure have advantageous features. By stacking device dies 102, 202, 302, 402, 502, etc. to form a die stack, and then bonding the die stack to device die 34, elevated temperature applied in the formation of the die stack will not be applied on the respective package substrate 12 because the die stack is formed before it is bonded onto package substrate 12. Further, the warpage of package substrate 12 caused by the elevated temperature used for forming the die stack is reduced or eliminated. In addition, in some embodiments, the stacking of device dies 202, 302, 402, and 502 onto wafer 100 is achieved through a chip-on-wafer process, which has a higher throughput than stacking dies on discrete dies as in other approaches.

In accordance with some embodiments of the present disclosure, a method includes bonding a first plurality of device dies onto a wafer, wherein the wafer includes a second plurality of device dies, with each of the first plurality of device dies bonded to one of the second plurality of device dies. The wafer is then sawed to form a die stack, wherein the die stack includes a first device die from the first plurality of device dies and a second device die from the second plurality of device dies. The method further includes bonding the die stack over a package substrate.

In accordance with alternative embodiments of the present disclosure, a method includes bonding a first plurality of device dies onto a wafer, wherein the wafer includes a second plurality of device dies, with each of the first plurality of device dies bonded to one of the second plurality of device dies. A third plurality of device dies is bonded onto the first plurality of device dies, with each of the third plurality of device dies bonded to one of the first plurality of device dies. The third plurality of device dies is identical to the first plurality of device dies. The wafer is sawed to form a plurality of die stacks, wherein each of the plurality of die stacks includes a first device die from the first plurality of device dies, a second device die from the second plurality of device dies, and a third device die from the third plurality of device dies. An additional device die is bonded onto a package substrate. After the bonding the additional device die onto the package substrate, one of the plurality of die stacks is bonded onto the additional device die.

In accordance with yet alternative embodiments of the present disclosure, a package includes a package substrate, a first device die over and bonded to the package substrate, and a die stack bonded to the first device die. The die stack includes a second device die over and bonded to the first device die, and a third device die over the second device die. The second device die and the third device die have identical integrated circuits, wherein a first top-view area of the second device die is different from a second top-view area of the third device die. The package is further bonded to a printed circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first plurality of device dies onto a wafer, wherein the wafer comprises a second plurality of device dies, with each of the first plurality of device dies bonded to one of the second plurality of device dies;
   sawing the wafer to form a die stack, wherein the die stack comprises a first device die from the first plurality of device dies and a second device die from the second plurality of device dies; and
   bonding the die stack to a package substrate.

2. The method of claim 1 further comprising:
bonding a third device die to the package substrate, wherein the bonding the die stack is performed after the bonding the third device die to the package substrate, and wherein a die in the die stack is bonded to the third device die.

3. The method of claim 1, wherein integrated circuits in the first device die and the second device die are identical to each other.

4. The method of claim 3, wherein after the sawing, the second device die has an area greater than an area of the first device die.

5. The method of claim 1 further comprising:
attaching a metal lid onto the package substrate; and
dispensing a Thermal Interface Material (TIM) to join a die in the die stack to the metal lid.

6. The method of claim 1 further comprising:
bonding a third plurality of device dies over the first plurality of device dies, with each of the third plurality of device dies bonded to one of the first plurality of device dies, wherein the first plurality of device dies and the third plurality of device dies have identical structures.

7. The method of claim 6 further comprising:
dispensing an underfill into a gap between the first device die and the second device die, wherein at a time the third plurality of device dies is bonded, one of the third plurality of device dies is over a combination of the first device die and the underfill; and
curing the underfill.

8. A method comprising:
bonding a first plurality of device dies onto a wafer, wherein the wafer comprises a second plurality of device dies, with each of the first plurality of device dies bonded to one of the second plurality of device dies;
bonding a third plurality of device dies onto the first plurality of device dies, with each of the third plurality of device dies bonded to one of the first plurality of device dies, wherein the third plurality of device dies is identical to the first plurality of device dies;
sawing the wafer to form a plurality of die stacks, wherein each of the plurality of die stacks comprises a first device die from the first plurality of device dies, a second device die from the second plurality of device dies, and a third device die from the third plurality of device dies;
bonding an additional device die onto a package substrate; and
after the bonding the additional device die onto the package substrate, bonding one of the plurality of die stacks onto the additional device die.

9. The method of claim 8, wherein after the bonding the one of the plurality of die stacks to the additional device die, the second device die in the one of the plurality of die stacks is bonded to the additional device die.

10. The method of claim 8, wherein after the bonding the one of the plurality of die stacks to the additional device die, the second device die is a top die of the one of the plurality of die stacks.

11. The method of claim 8 further comprising:
attaching a metal lid onto the package substrate; and
dispensing a Thermal Interface Material (TIM) to join the plurality of die stacks to the metal lid.

12. The method of claim 8, wherein the first plurality of device dies comprises integrated circuits identical to integrated circuits in the second plurality of device dies, and wherein in the plurality of die stacks, the second plurality of device dies has sizes greater than sizes of the first plurality of device dies.

13. The method of claim 8 further comprising:
dispensing an underfill into gaps between the first plurality of device dies and the second plurality of device dies, wherein at a time the third plurality of device dies is bonded, the third device dies is over the underfill; and
curing the underfill.

14. The method of claim 8, wherein the first plurality of device dies, the second plurality of device dies, and the third plurality of device dies are memory dies, and wherein the additional device die is a logic device die.

15. A method comprising:
bonding a first device die and a second device die with a third device die and a fourth device die, respectively, wherein the first device die and the second device die are parts of an unsawed wafer;
dispensing a first underfill between the first device die and the third device die, and between the second device die and the fourth device die;
bonding a fifth device die and a sixth device die to the third device die and the fourth device die, respectively, wherein at a time the fifth device die and the sixth device die are bonded, the fifth device die and the sixth device die are overlying the first underfill;
dispensing a second underfill between the third device die and the fifth device die, and between the fourth device die and the sixth device die; and
sawing the unsawed wafer to separate a plurality of die stacks from each other, wherein the first device die, the third device die, the fifth device die, a portion of the first underfill, and a portion of the second underfill are in one of the plurality of die stacks.

16. The method of claim 15 further comprising:
bonding an additional device die onto a package substrate; and
after the bonding the additional device die onto the package substrate, bonding the one of the plurality of die stacks onto the additional device die.

17. The method of claim 15, wherein after the first underfill is dispensed, a gap between the third device die and the fourth device die is unfilled with the first underfill.

18. The method of claim 15, wherein the first underfill is dispensed before the fifth device die is bonded to the third device die, and the first underfill and the second underfill are dispensed in different process steps.

19. The method of claim 15, wherein the first underfill and the second underfill are discrete underfill regions separated from each other.

20. The method of claim 8, wherein the wafer comprises memory devices or logic devices therein.

* * * * *